(12) United States Patent
Aude

(10) Patent No.: US 6,580,325 B1
(45) Date of Patent: Jun. 17, 2003

(54) AMPLIFIER WITH MILLER-EFFECT FREQUENCY COMPENSATION

(75) Inventor: Arlo Aude, Atlanta, GA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/231,787

(22) Filed: Aug. 29, 2002

(51) Int. Cl.[7] .............................. H03F 3/45; H03F 1/14; H03F 1/34
(52) U.S. Cl. .................... 330/260; 330/292; 330/294
(58) Field of Search ............................. 330/260, 292, 330/294

(56) References Cited

U.S. PATENT DOCUMENTS

| | | | | |
|---|---|---|---|---|
| 4,263,563 A | * | 4/1981 | Congdon | 330/265 |
| 4,484,148 A | * | 11/1984 | Wieser et al. | 330/253 |
| 4,511,857 A | * | 4/1985 | Gunderson | 330/311 |
| 4,774,478 A | * | 9/1988 | Taylor | 330/294 |
| 5,486,790 A | * | 1/1996 | Huijsing et al. | 330/260 |
| 5,834,976 A | * | 11/1998 | Tomasini et al. | 330/292 |

OTHER PUBLICATIONS

Design Techniques for Cascoded CMOS OP Amps with Improved PSSR and Common–Mode Input Range of David Ribner and Miles Copeland, IEEE 1984.*

* cited by examiner

Primary Examiner—Patricia Nguyen
(74) Attorney, Agent, or Firm—Wildman Harrold Allen & Dixon

(57) ABSTRACT

An amplifier with Miller-effect frequency compensation in which the Miller feedback capacitor is connected to an internal terminal of the amplifier having a low impedance, and shunt compensation circuitry is connected to an intermediate signal terminal that drives the output amplifier stage. The compensation circuitry, which includes serially coupled capacitive and resistive circuit elements, introduces a high frequency zero to cancel one of the high frequency complex poles introduced by the Miller feedback capacitor connection.

14 Claims, 16 Drawing Sheets

AMPLIFIER WITH MILLER-EFFECT FREQUENCY COMPENSATION

BACKGROUND OF THE INVENTION

1. Field of the Invention

The present invention relates to frequency compensated amplifiers, and in particular, to amplifier circuits with Miller-effect frequency compensation.

2. Description of the Related Art

Miller feedback is commonly used to compensate multistage amplifiers. By adding a feedback capacitance around an intermediate amplifier stage phase compensation is provided by introducing a pole-zero cancellation. As is well known, due to the Miller effect, a response zero is developed in the amplifier stage having the feedback capacitance such that the response zero is coincident with the pole of the succeeding amplifier stage.

A drawback of Miller feedback is a poor power supply rejection ratio (PSRR). At high frequency, standard Miller feedback causes the PSRR to begin to degrade at the dominant pole frequency. This can be improved, as shown by Ribner and Copeland in "Design Techniques for Cascoded CMOS Op Amps With Improved PSRR and Common Mode Input Range", IEEE JSSCC December 1984 (Ribner et al., incorporated herein by reference), by feeding the Miller capacitance back to a low impedance node. This method provides a significant improvement to the PSRR. However, it also creates two complex poles at high frequency that often cause the amplifier to be unstable.

Referring to FIG. 1, a folded cascode amplifier has been proposed using a modified Miller feedback as described by Ribner et al. Capacitor C2 is traditionally used to compensate the Miller loop. For the following discussion, it is assumed that capacitor C2 is significantly larger than the gate-to-source capacitance $C_{GS}$ of transistor M4. In cases where this is not true, a low input capacitance buffer (not shown), such as a source follower, can be connected between node N1 and the gate terminal of transistor M4 to reduce the capacitive loading on the high impedance node N1 by transistor M4. (In the Figures and throughout the following discussion, transistors M1, M2, M3, M4, M5, M6, M7, M8 are insulated gate field effect transistors, such as P-type and N-type metal oxide semiconductor field effect transistors (P-MOSFETs and N-MOSFETs), and are depicted using conventional transistor symbols for P-MOSFETs and N-MOSFETs.)

Referring to FIGS. 2 and 3, there are two loops in the system that need to be analyzed. The first is the traditional DC loop as depicted in FIG. 2. The loop characteristics of this DC system are well known in the art and, therefore, need not be analyzed here. The second is the Miller feedback loop as depicted in FIG. 3. As is well known, when analyzing the Miller loop, the inputs to the DC loop are AC grounded. In this way, the characteristics of the Miller loop can be determined independently of the DC loop. Capacitor C1 creates a zero at DC and a dominant pole due to the high impedance of node V3 reflected through transistor M1. The Miller loop also has two low frequency poles at nodes V3 and Vout due to capacitors C2 and C1. It is these two poles that converge when the Miller loop is closed, thus giving rise to a pair of complex poles in the DC loop. Eliminating one of these poles would significantly improve the loops' stability.

Referring to FIG. 4, the Miller loop can be simplified as shown. Referring to FIG. 5, this circuit can be modeled to a first order as shown. For simplicity, the capacitance of capacitor C1 is set to A times the capacitance of capacitor C2 (Equation 0). The loop transmission can be characterized by Equation 1. As expected, the cascode portion of the loop contributes a DC zero, and two poles, while the output stage contributes a single pole as expressed by Equation 2.

$$c_1 \chi A C_2 \chi A C \qquad \text{Equation 0:}$$

$$\text{Equation 1:} \quad \frac{V_o}{V_i} = \left[ \frac{(sAC(gds_1 + gm_1 + gmb_1))}{((gds_2 + gds_1 + sC)(gds_3 + gds_1 + gm_1 + gmb_1 + sAC) - (gds_1)(gds_1 + gm_1 + gmb_1))} \right] \left[ \frac{-gm_4}{gds_4 + s(AC)} \right]$$

$$\text{Equation 2:} \quad \omega_{p3} \approx \frac{gds_4}{AC}$$

Finding the poles of the cascoded stage is somewhat more involved. Using the standard form for solving the roots of a second order equation produces Equations 3–9. Equation 10 is presented as a compact expression for the total Miller loop system response.

$$\text{Equation 3:} \quad r = \frac{-b \pm \sqrt{b^2 - 4ac}}{2a}$$

$$b^2 \chi gds_1 AC + 2gds_1(gds_3 + gds_1 + gm_1 + gmb_1)AC^2 + ((gds_3 + gds_1 + gm_1 + gmb_1)^2 C^2 \qquad \text{Equation 4:}$$

$$4ac\chi 4AC^2(gds_2 gds_3 + gds_2 gds_1 + gds_2(gm_1 + gmb_1) + gds_3 gds_1) \qquad \text{Equation 5:}$$

$$b = (gds_1 AC + (gds_3 + gds_1 + gm_1 + gmb_1)C) \qquad \text{Equation 6:}$$

$$2a = 2AC^2 \qquad \text{Equation 7:}$$

$$\text{Equation 8:} \quad \omega_{p1} = \frac{(gds_1 AC + (gds_3 + gds_1 + gm_1 + gmb_1)C)}{2AC^2} - \frac{\sqrt{gds_1 AC + 2gds_1(gds_3 + gds_1 + gm_1 + gmb_1)AC^2 + (gds_3 + gds_1 + gm_1 + gmb_1)^2 C^2 - 4AC^2(gds_2 gds_3 + gds_2 gds_1 + gds_2(gm_1 + gmb_1) + gds_3 gds_1)}}{(2AC^2)}$$

Equation 9: $$\omega_{p1} = \frac{(gds_1 AC + (gds_3 + gds_1 + gm_1 + gmb_1)C)}{2AC^2} +$$

$$\frac{\sqrt{gds_1 AC + 2gds_1(gds_3 + gds_1 + gm_1 + gmb_1)AC^2 + (gds_3 + gds_1 + gm_1 + gmb_1)^2 C^2 - 4AC^2(gds_2 gds_3 + gds_2 gds_1 + gds_2(gm_1 + gmb_1) + gds_3 gds_1)}}{(2AC^2)}$$

Equation 10: $$\frac{V_o}{V_i} = \left[(gds_1 + gm_1 + gmb_1)\frac{(-gm_4)}{gds_4}\right]$$

$$\left[\frac{sAC}{\left(1 + \frac{s}{\omega_{p1}}\right)\left(1 + \frac{s}{\omega_{p2}}\right)}\right]\left[\frac{1}{1 + \frac{s}{\omega_{p3}}}\right]$$

The pole at frequency $\omega_{p1}$ can be shown to be much lower than the pole at frequency $\omega_{p2}$ and thus of little interest for purposes of this analysis since it is effectively canceled by the zero at DC. Using the assumption expressed by Equation 11 and for moderately low values of the factor A, the expression for the pole at frequency $\omega_{p2}$ can be simplified as shown in Equation 12.

$$gm \approx 10 gmbs \approx 100 gds \qquad \text{Equation 11:}$$

Equation 12: $$\omega_{p2} \approx \frac{b}{a} \approx \frac{(gds_1 AC + (gds_3 + gds_1 + gm_1 + gmb_1)C)}{AC^2} \approx$$

$$\frac{(gds_1 AC + (gm_1 + gmb_1)C)}{AC^2} \approx \frac{gm_1 + gmb_1}{AC} \approx \frac{gm_1}{AC}$$

Referring to FIGS. 6–9, the open loop frequency responses for two nodes in the circuit of FIG. 5 are produced. FIG. 6 depicts the magnitude response as seen from node voltage Vi to node voltage V3, while FIG. 7 depicts the phase response. From this it can be seen that the pole at frequency $\omega_{p2}$ has already degraded the phase margin by 90 degrees. If the pole at the output is sufficiently low, the system will be unstable and exhibit peaking at the unity gain frequency. FIG. 8 depicts the open loop magnitude response from node voltage Vi to node voltage Vo. From this it can be seen that the output pole causes the high frequency rolloff to degrade with two poles before the unity gain frequency. FIG. 8 also depicts the closed loop magnitude response. FIG. 9 depicts the open and closed loop phase response from which it is evident that the phase margin is nearly zero. Therefore, the Miller loop is unstable and will cause severe peaking when inserted in the DC loop.

While the DC loop is not analyzed here in detail, a brief explanation of the effect of the Miller loop can be provided. Referring back to FIG. 1, it is clear that transistor M1 provides a current into the impedance seen at node V2. FIG. 10 depicts the impedance at node V2 when the Miller loop is closed and the DC loop is open. The resonant peak is due to the poorly compensated Miller loop. FIG. 11 depicts the open and closed loop magnitude response of the DC loop. The peaking here is at the same frequency as the peaking in the impedance at node V2, as well as the peaking in the frequency response of the Miller feedback loop. FIG. 12 depicts the open and closed loop phase response of the DC loop. Though not depicted in detail here, it should nonetheless be seen that the phase response of the closed loop system is nearly identical to the phase response of the closed loop Miller feedback system as depicted in FIG. 9.

SUMMARY OF THE INVENTION

An amplifier with Miller-effect frequency compensation in accordance with the presently claimed invention includes a high frequency zero that cancels one of the high frequency complex poles thereby leaving one real pole. Cancellation of such pole significantly improves the bandwidth and stability of the Miller feedback system, and can be accomplished with consistency over PVT (variations in fabrication processes P, power supply voltage V and temperature T). In accordance with the presently claimed invention, the Miller feedback capacitor is connected to an internal terminal of the amplifier having a low impedance, and shunt compensation circuitry is connected to an intermediate signal terminal that drives the output amplifier stage. The compensation circuitry, which includes serially coupled capacitive and resistive circuit elements, introduces a high frequency zero to cancel one of the high frequency complex poles introduced by the Miller feedback capacitor connection.

In accordance with one embodiment of the presently claimed invention, an amplifier with Miller-effect frequency compensation includes first and second amplification circuitry, feedback capacitance and compensation circuitry. The first amplification circuitry, including an internal terminal and a first output terminal, receives and amplifies an input signal to provide a first amplified signal via the first output terminal. The internal terminal has an internal terminal impedance associated therewith, the first output terminal has an output terminal impedance associated therewith, and the internal terminal impedance is substantially lower than the output terminal impedance. The second amplification circuitry, coupled to the first output terminal and including a second output terminal, receives and further amplifies the first amplified signal to provide a second amplified signal via the second output terminal. The feedback capacitance is coupled between the second output terminal and the internal terminal. The compensation circuitry is coupled in shunt to the first output terminal and includes capacitive and resistive circuit elements mutually coupled in series.

In accordance with another embodiment of the presently claimed invention, an amplifier with Miller-effect frequency compensation includes first and second power supply terminals, first and second amplification circuitry, feedback capacitance and compensation circuitry. The first amplification circuitry, coupled between the first and second power supply terminals and including an internal terminal and a first output terminal, receives and amplifies an input signal to provide a first amplified signal via the first output terminal. The internal terminal has an internal terminal impedance associated therewith, the first output terminal has an output terminal impedance associated therewith, and the internal terminal impedance is substantially lower than the output terminal impedance. The second amplification circuitry, coupled between the first and second power supply terminals and to the first output terminal and including a second output terminal, receives and further amplifies the first amplified signal to provide a second amplified signal via the second output terminal. The feedback capacitance is coupled between the second output terminal and the internal terminal. The compensation circuitry is coupled between the first output terminal and the first power supply terminal and includes serially coupled capacitive and resistive circuit elements.

In accordance with still another embodiment of the presently claimed invention, an amplifier with Miller-effect frequency compensation includes first and second amplifier means, feedback means and shunting means. The first amplifier means is for receiving a feedback signal, receiving and amplifying an input signal and providing a first amplified signal. The second amplifier means is for receiving and further amplifying the first amplified signal and providing a second amplified signal, wherein the first and second amplifier means together have a transfer function associated therewith. The feedback means is for selectively feeding back the second amplified signal as the feedback signal to the first amplifier means, thereby introducing to the transfer function one or more high frequency complex poles. The shunting means is for selectively shunting the first amplified signal, thereby introducing to the transfer function at least one high frequency zero that substantially cancels one of the one or more high frequency complex poles.

In accordance with yet another embodiment of the presently claimed invention, an amplifier with Miller-effect frequency compensation includes first and second amplifier means, feedback means and shunting means. The first amplifier means is for receiving a feedback signal, receiving and amplifying an input signal and providing a first amplified signal. The second amplifier means is for receiving and further amplifying the first amplified signal and providing a second amplified signal. The feedback means is for selectively feeding back the second amplified signal as the feedback signal to the first amplifier means. The shunting means is for selectively shunting the first amplified signal. Together the first and second amplifier means, the feedback means and the shunting means have associated therewith a transfer function with one or more high frequency complex poles and a high frequency zero which is complementary to one of the one or more high frequency complex poles.

DETAILED DESCRIPTION OF THE INVENTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

Figure 1:
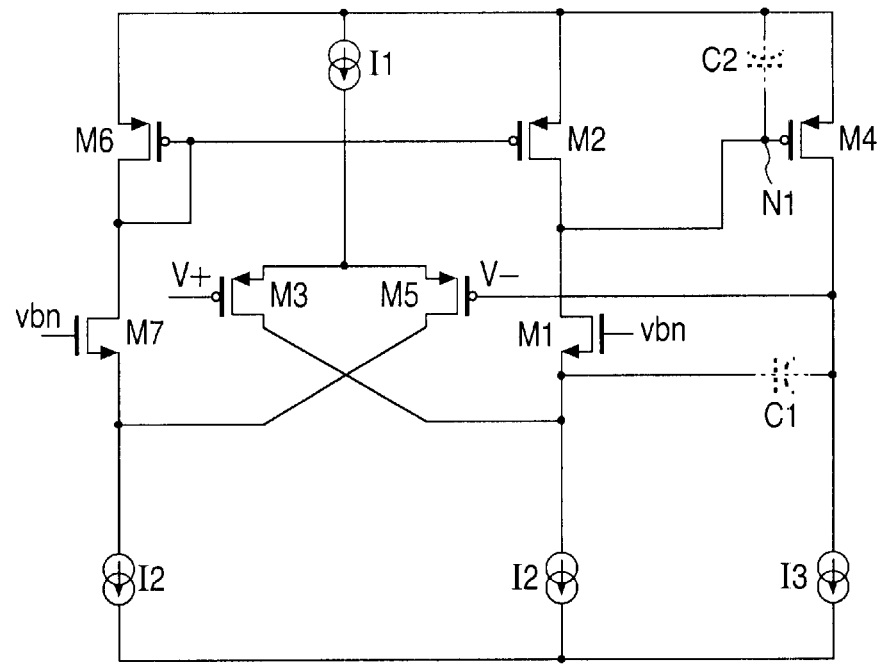
FIG. 1 is a schematic diagram of a multistage amplifier using modified Miller feedback.
Figure 2:
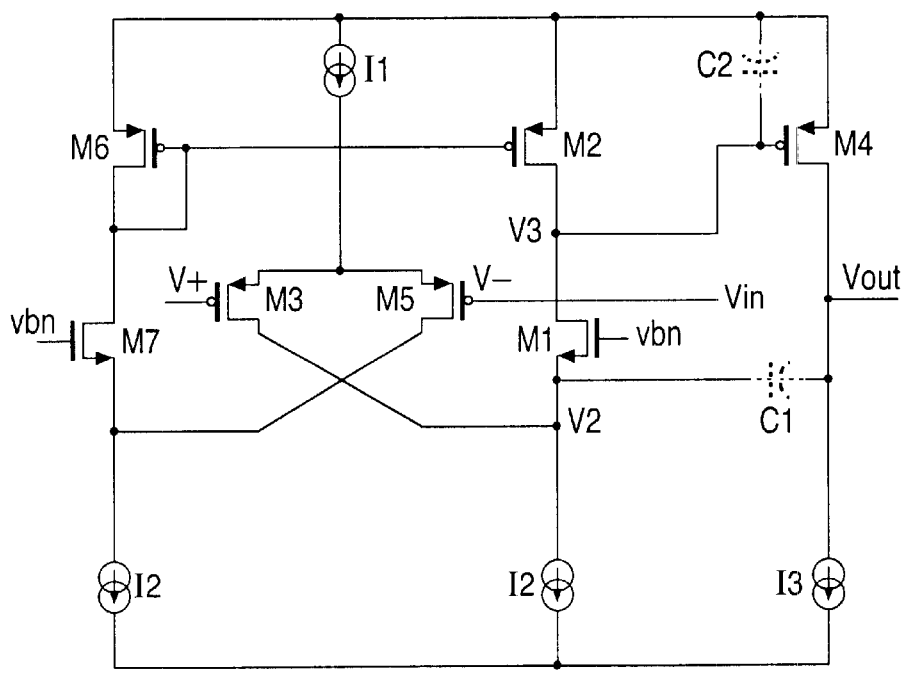
FIG. 2 is a schematic diagram for the circuit of FIG. 1 for analyzing the DC loop characteristics.
Figure 3:
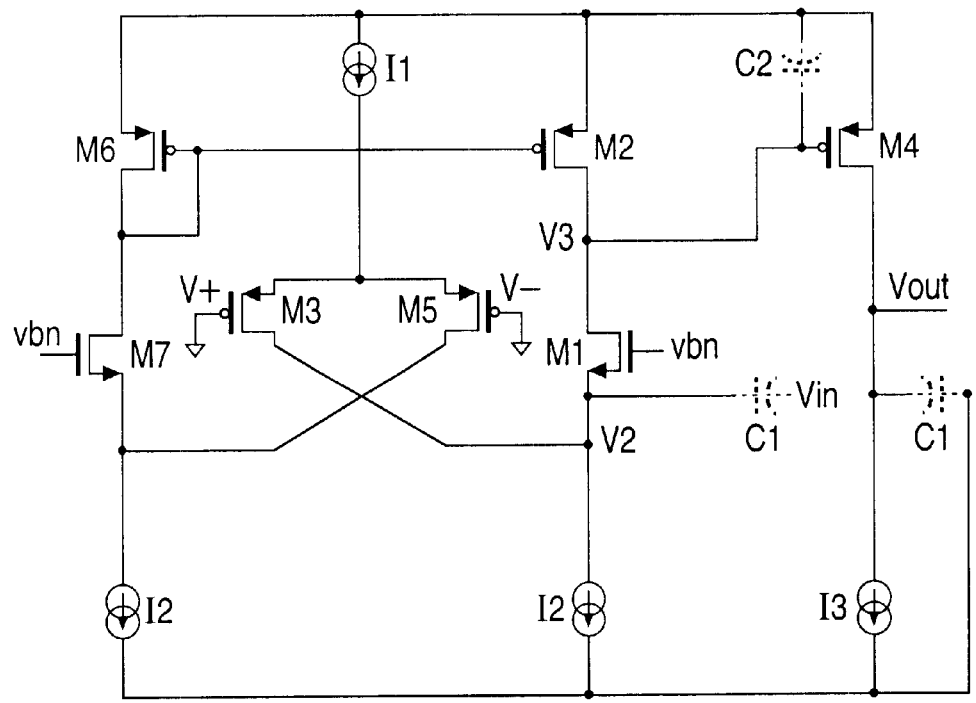
FIG. 3 is a schematic diagram for the circuit of FIG. 1 for analyzing the Miller loop characteristics.
Figure 4:
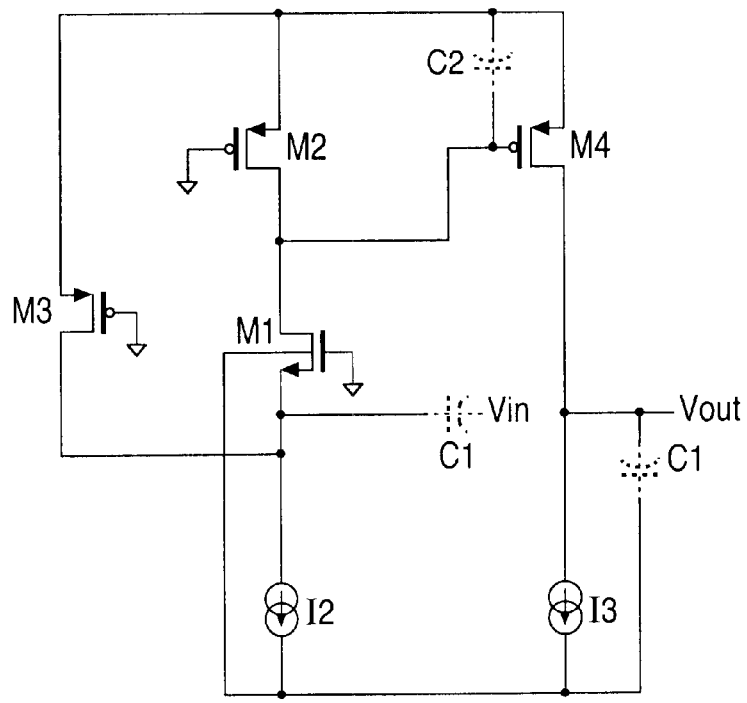
FIG. 4 is a schematic diagram in which the circuit of FIG. 3 has been simplified for a qualitative analysis of the Miller loop characteristics.
Figure 5:
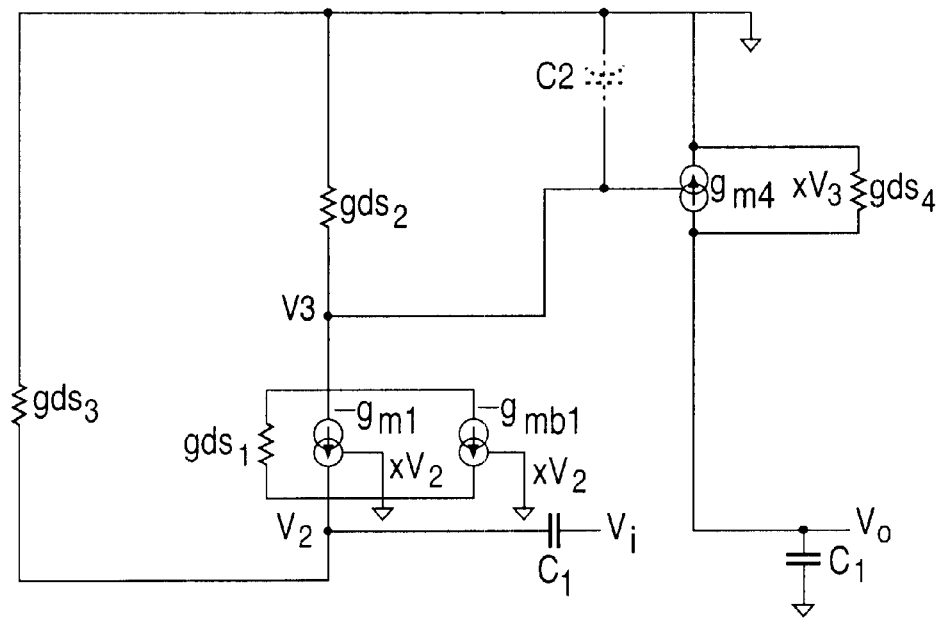
FIG. 5 is a schematic diagram of a circuit model for the circuit of FIG. 4.
Figure 13:
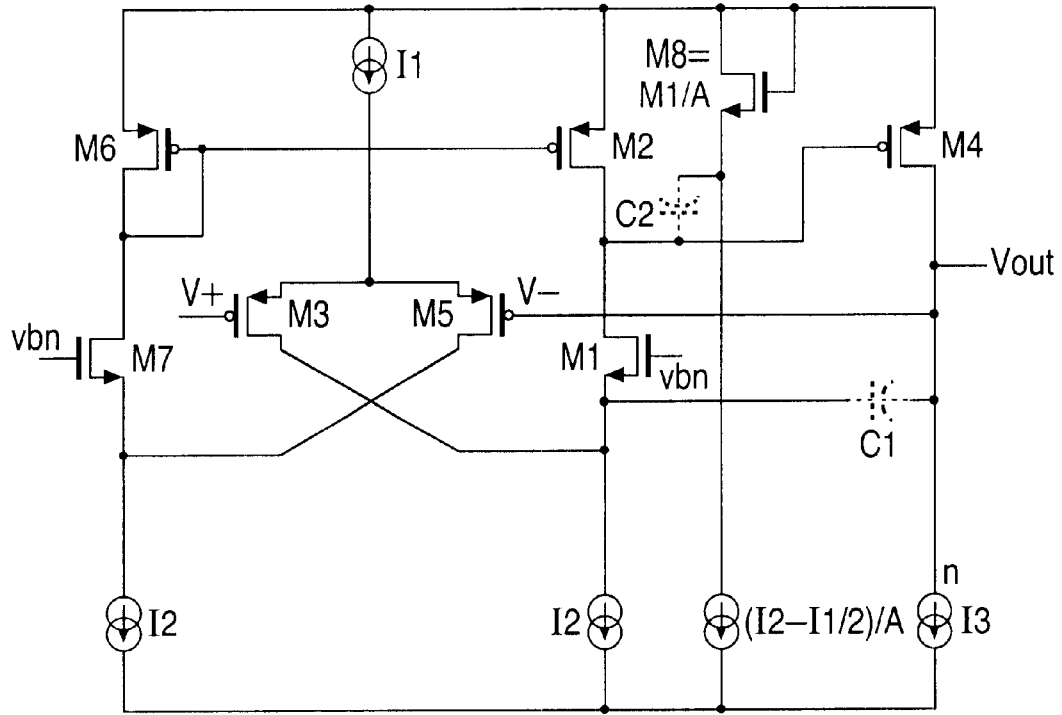
FIG. 13 is a schematic diagram of a folded cascode amplifier in accordance with one embodiment of the presently claimed invention.
Figure 6:
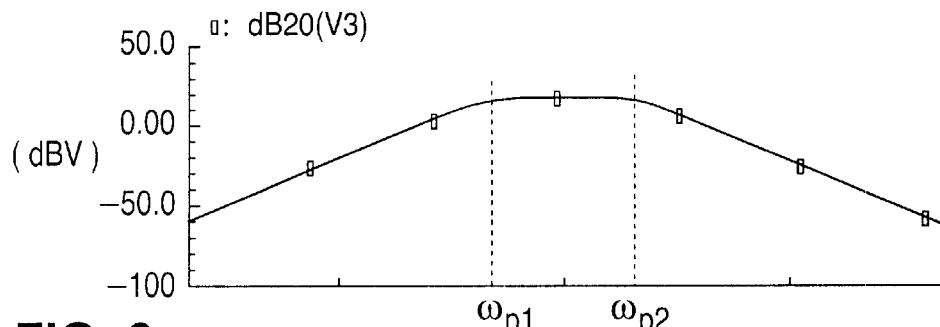
FIG. 6 is a graph of the open loop magnitude response for the circuit of FIG. 5 from input node voltage Vi to intermediate node voltage V3.
Figure 7:
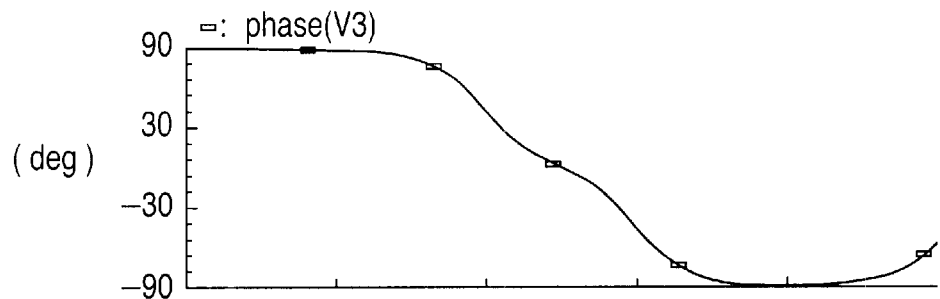
FIG. 7 is a graph of the open loop phase response for the circuit of FIG. 5 from input node voltage Vi to intermediate node voltage V3.
Figure 8:
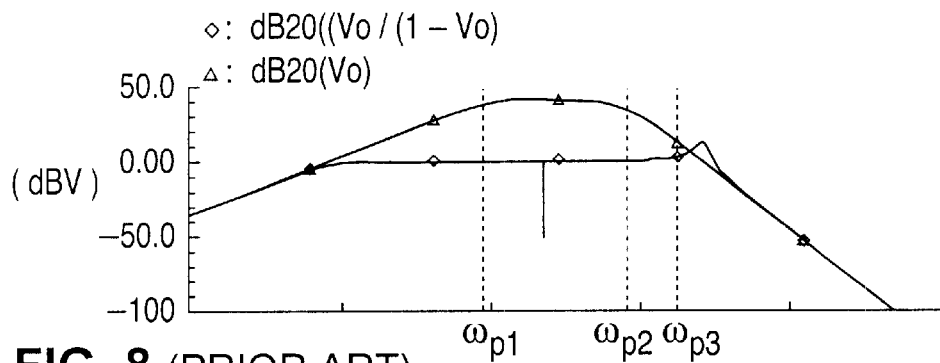
FIG. 8 is a graph of the open and closed loop magnitude responses for the circuit of FIG. 5 from input node voltage Vi to output node voltage Vo.
Figure 9:
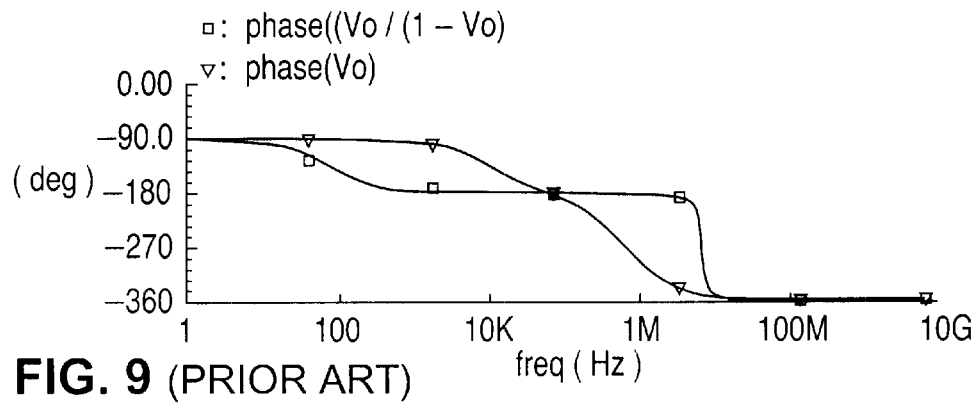
FIG. 9 is a graph of the open and closed loop phase responses for the circuit of FIG. 5 from input node voltage Vi to output node voltage Vo.

Referring to FIG. 13, the phase response of the Miller loop can be significantly improved if the pole at frequency $\omega_{p2}$ is eliminated. As expressed in Equation 13, insertion of a resistor of value $R_z$ in series with capacitor $C_2$ will produce a zero at the frequency $\omega_{z2}$ expressed in Equation 14, thus making this a single pole system as expressed in Equation 15.

$$\text{Equation 13:} \quad R_z \approx \frac{A}{gm_1}$$

$$\text{Equation 14:} \quad \omega_{z2} \approx \frac{gm_1}{AC}$$

$$\text{Equation 15:} \quad \frac{V_o}{V_i} = \left[(gds_1 + gm_1)\frac{(-gm_4)}{gds_4}\right]\left[\frac{sAC\left(1+\frac{s}{\omega_{z1}}\right)}{\left(1+\frac{s}{\omega_{p1}}\right)\left(1+\frac{s}{\omega_{p2}}\right)}\right]$$

-continued $$\frac{1}{1+\frac{s}{\omega_{p3}}}\right] = \left[(gds_1 + gm_1)\frac{(-gm_4)}{gds_4}\right]\left[\frac{sAC}{\left(1+\frac{s}{\omega_{p1}}\right)}\right]\left[\frac{1}{1+\frac{s}{\omega_{p3}}}\right]$$

The resistance $R_z$ can be implemented in a number of ways. One implementation is shown in FIG. 13 that tracks the transconductance $gm_1$ of transistor M1 over process temperature and voltage. A transistor M8 that has a width-to-length W/L ratio of 1/A times that of transistor M1, i.e., W8/L8=(W1/L1)/A, is operated with a current I8 of 1/A times the current I1 in transistor M1 so as to provide a diode connected device with an equivalent resistance $R_z$ equal to $A/gm_1$ in series with capacitor C2.

Figure 14:
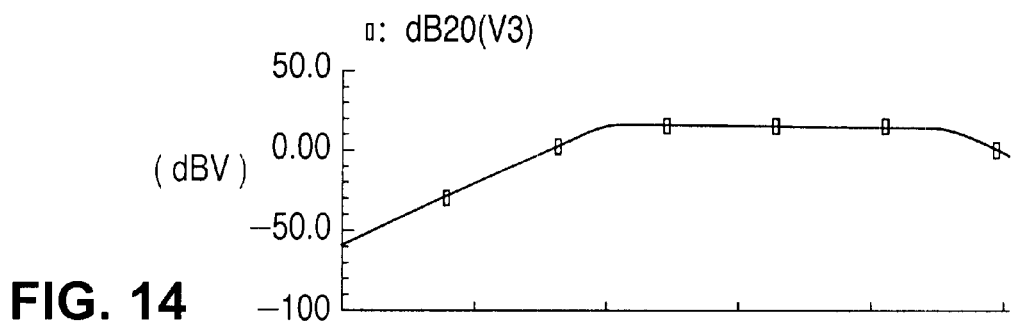
FIG. 14 is a graph of the open loop magnitude response for the circuit of FIG. 13 from input node voltage Vi to intermediate node voltage V3.
Figure 15:
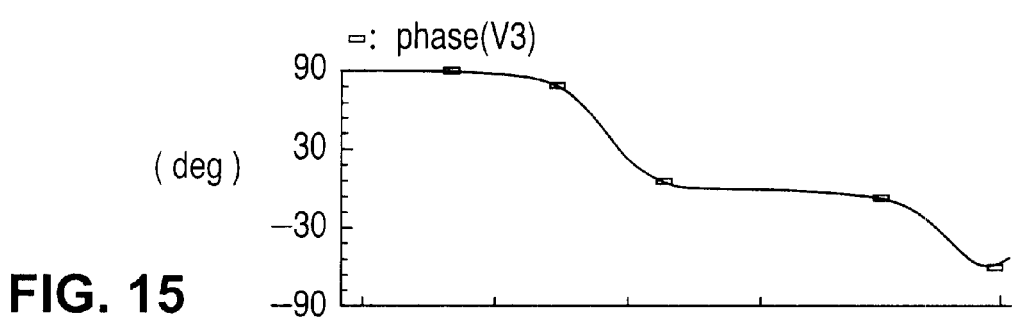
FIG. 15 is a graph of the open loop phase response for the circuit of FIG. 13 from input node voltage Vi to intermediate node voltage V3.
Figure 16:
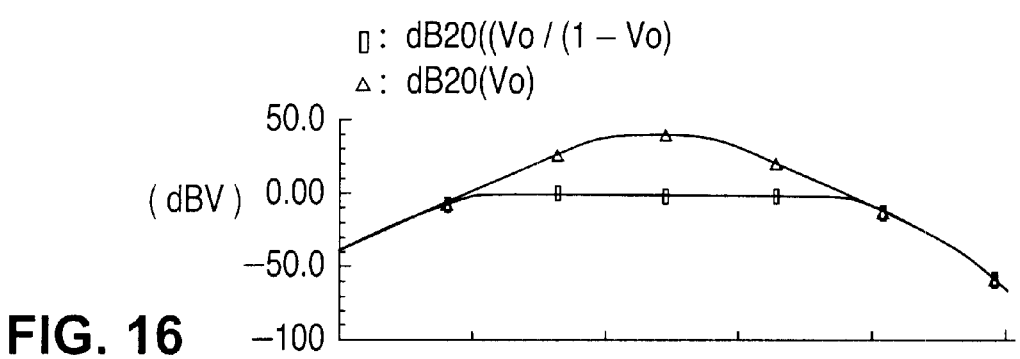
FIG. 16 is a graph of the open and closed loop magnitude responses for the circuit of FIG. 13 from input node voltage Vi to output node voltage Vo.
Figure 17:
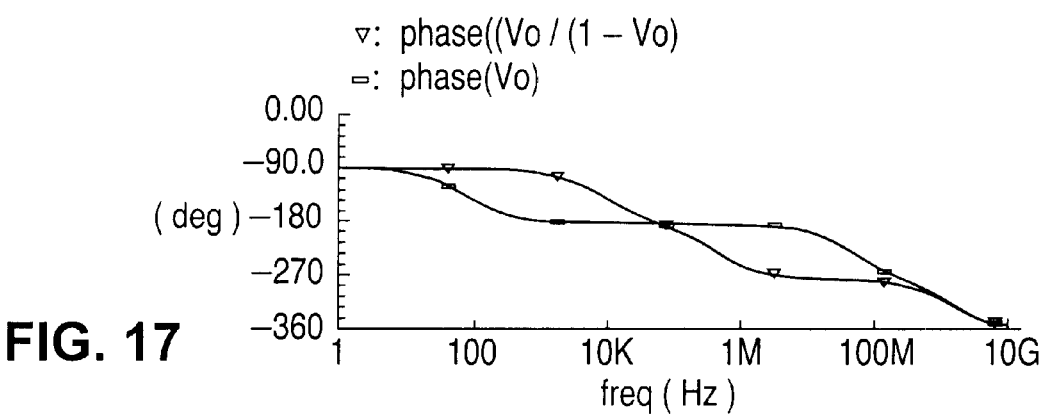
FIG. 17 is a graph of the open and closed loop phase responses for the circuit of FIG. 13 from input node voltage Vi to output node voltage Vo.

FIG. 14 depicts the open loop magnitude response from node voltage Vi to node voltage V3 with the additional zero $\omega_{z2}$ included. FIG. 15 depicts the phase response. It is clear that the insertion of this additional zero $\omega_{z2}$ has dramatically improved the frequency response. The remaining high frequency pole is associated with the gate-to-drain capacitance Cgd of transistors M1 and M2 which can be made quite small. FIGS. 16 and 17 depict the open and closed loop magnitude and phase responses, respectively. The loop now rolls off as a single pole system with a phase margin of 90 degrees.

Figure 10:
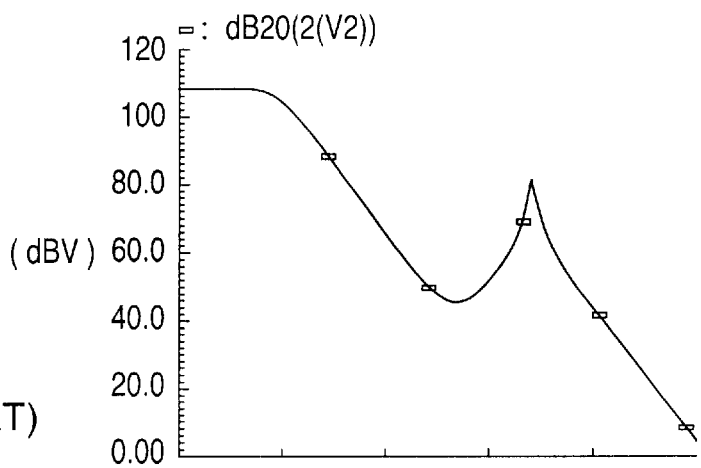
FIG. 10 is a graph of the impedance for the circuit of FIG. 5 at the node for voltage V2 when the Miller loop is closed and the DC loop is open.
Figure 11:
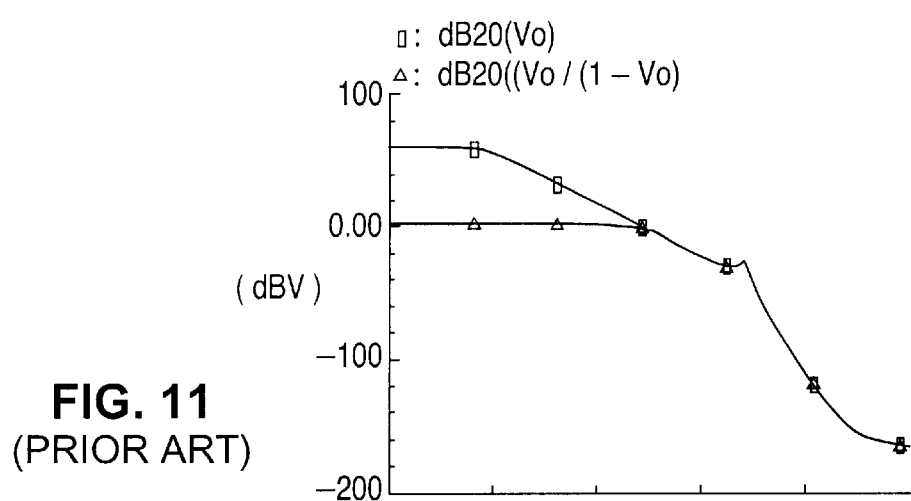
FIG. 11 is a graph of the open and closed loop magnitude responses of the DC loop for the circuit of FIG. 5.
Figure 12:
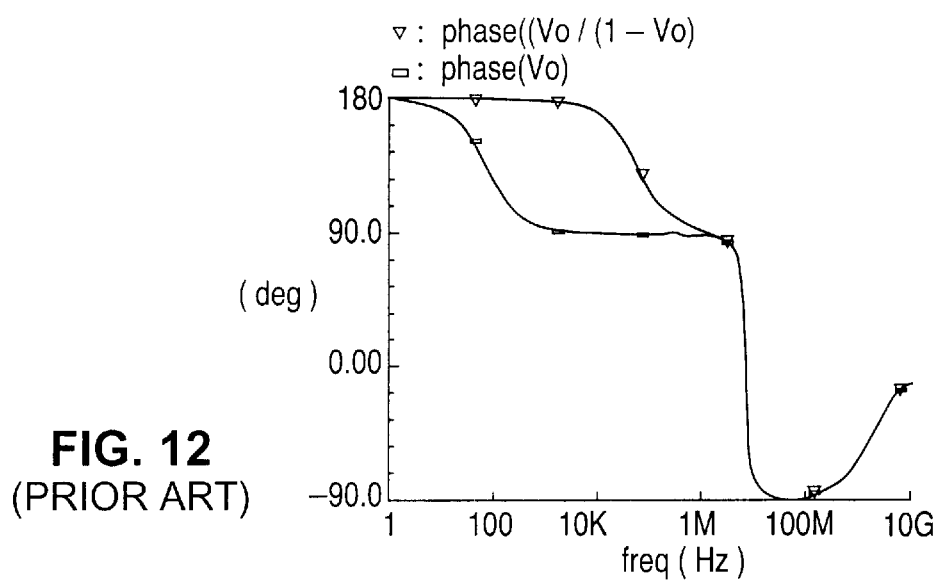
FIG. 12 is a graph of the open and closed loop phase responses of the DC loop for the circuit of FIG. 5.
Figure 18:
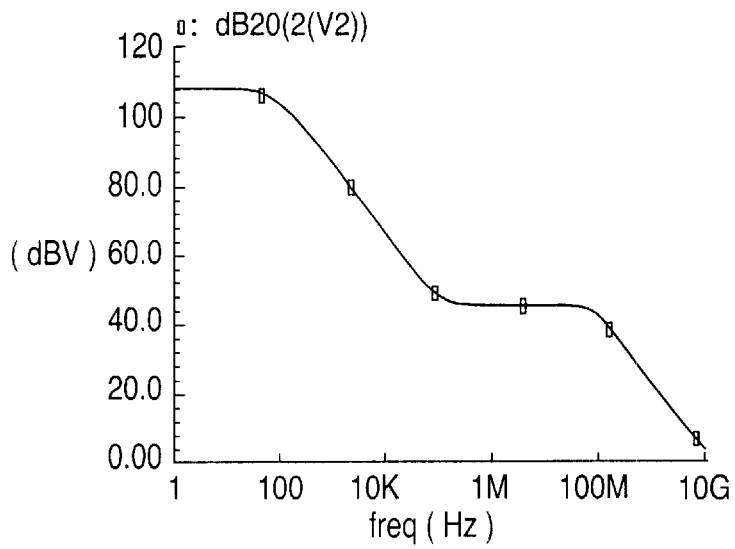
FIG. 18 is a graph of the impedance for the circuit of FIG. 13 at the node for voltage V2 when the Miller loop is closed and the DC loop is open.
Figure 19:
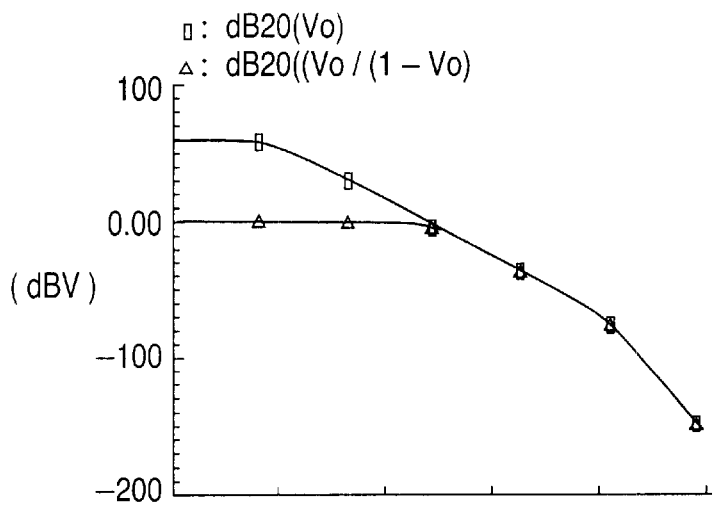
FIG. 19 is a graph of the open and closed loop magnitude responses of the DC loop for the circuit of FIG. 13.
Figure 20:
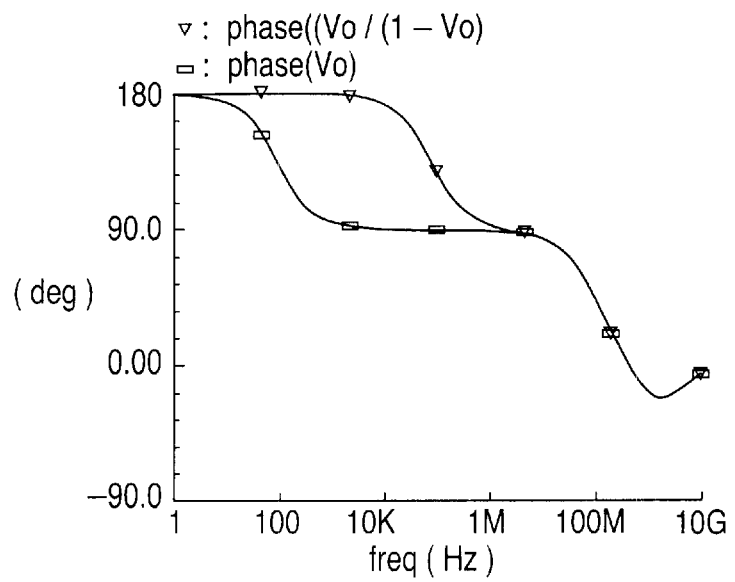
FIG. 20 is a graph of the open and closed loop phase responses of the DC loop for the circuit of FIG. 13.

FIGS. 18–20 depict impedance and magnitude and phase responses corresponding to those depicted in FIGS. 10–12 with the additional zero $\omega_{z2}$ in the system. It can be seen that the impedance at node V2 is dramatically improved. The resonant peak has been eliminated. For the open and closed loop magnitude responses in FIG. 19, the resonant peak is also eliminated. FIG. 20 depicts the open and closed loop phase responses. The system now exhibits a single real non-dominant pole. This pole has not been calculated here, but it is evident that this pole is due to the closed loop response of the Miller feedback system, and is at the frequency at which the Miller feedback system goes below a gain of unity in the open loop case. In other words, the non-dominant pole of the DC loop is equal to the high frequency gain bandwidth of the Miller loop. The low frequency gain bandwidth of the Miller loop determines the dominant pole of the DC loop.

Many circuit configurations are possible for implementing an amplifier with Miller-effect frequency compensation in accordance with the presently claimed invention. Two primary requirements are some form of Miller feedback to a low impedance circuit node, such as the source terminal of a cascode circuit. FIGS. 21–28 represent a number of common amplifier types that have been modified to implement amplifiers with Miller-effect frequency compensation in accordance with the presently claimed invention. The primary application of this compensation includes a resistance in series with capacitor C2. Other than as a resistor per se, such resistance can be implemented in a number of ways which are well known in the art, such as with a P-MOSFET or an N-MOSFET. Regardless of the specific implementation, it is advantageous to design the circuit such that the resistance tracks the transconductance gm1 of transistor M1 and the aforementioned factor A as expressed in Equation 13. In the case of a P-MOSFET or N-MOSFET used as the resistance, the device is biased with a ratio of the same current that flows through the cascode circuitry to provide excellent tracking of transconductance gm over PVT.

Figure 21:
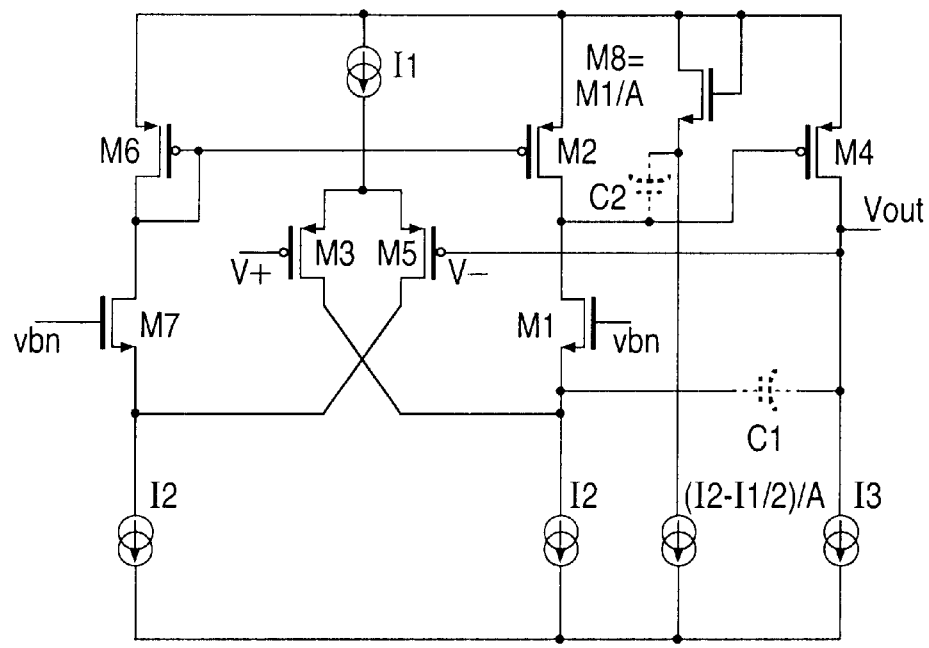
FIG. 21 is a schematic diagram of an input folded cascode amplifier in accordance with another embodiment of the presently claimed invention.

FIG. 21 is a P-MOSFET input folded cascode amplifier using an N-MOSFET as the resistance to provide the zero.

Figure 22:
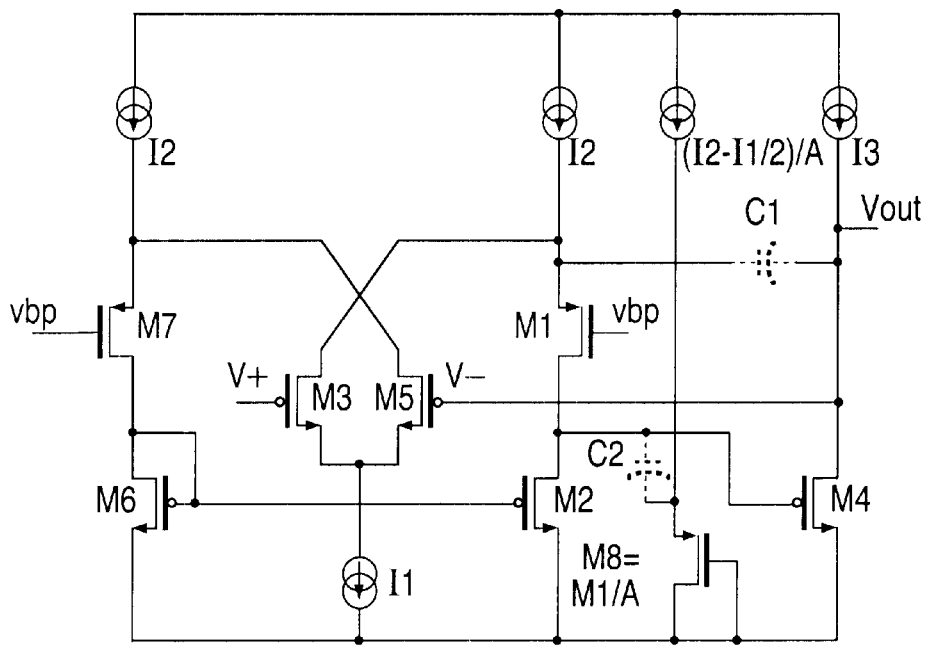
FIG. 22 is a schematic diagram of another input folded cascode amplifier in accordance with still another embodiment of the presently claimed invention.

FIG. 22 is an N-MOSFET input folded cascode amplifier using a P-MOSFET as the resistance to provide the zero.

Figure 23:
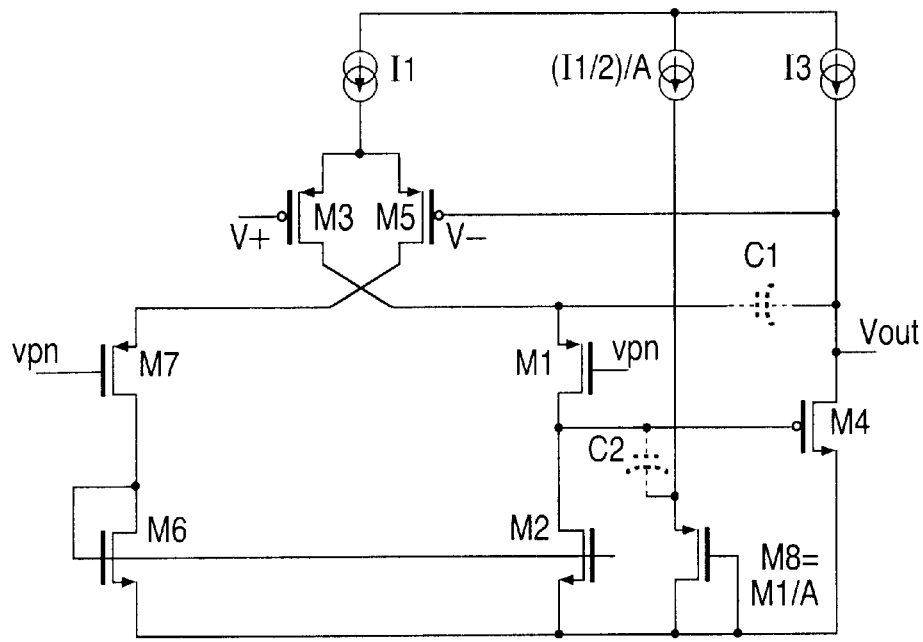
FIG. 23 is a schematic diagram of a telescopic amplifier in accordance with another embodiment of the present invention.

FIG. 23 is a P-MOSFET telescopic amplifier using a P-MOSFET as the resistance to provide the zero.

Figure 24:
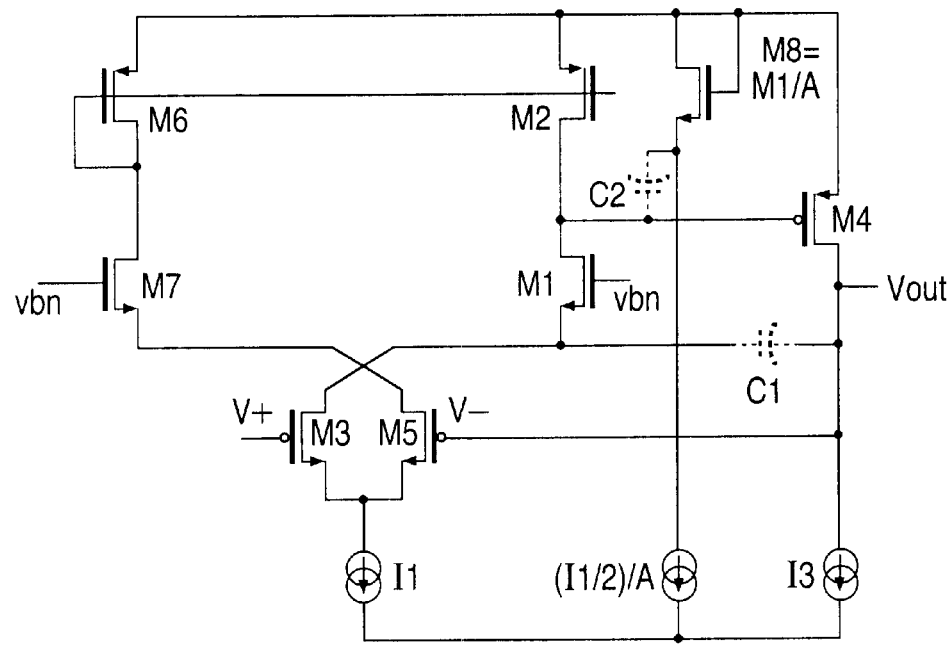
FIG. 24 is a schematic diagram of another telescopic amplifier in accordance with still another embodiment of the presently claimed invention.

FIG. 24 is an N-MOSFET telescopic amplifier using an N-MOSFET as the resistance to provide the zero.

Figure 25:
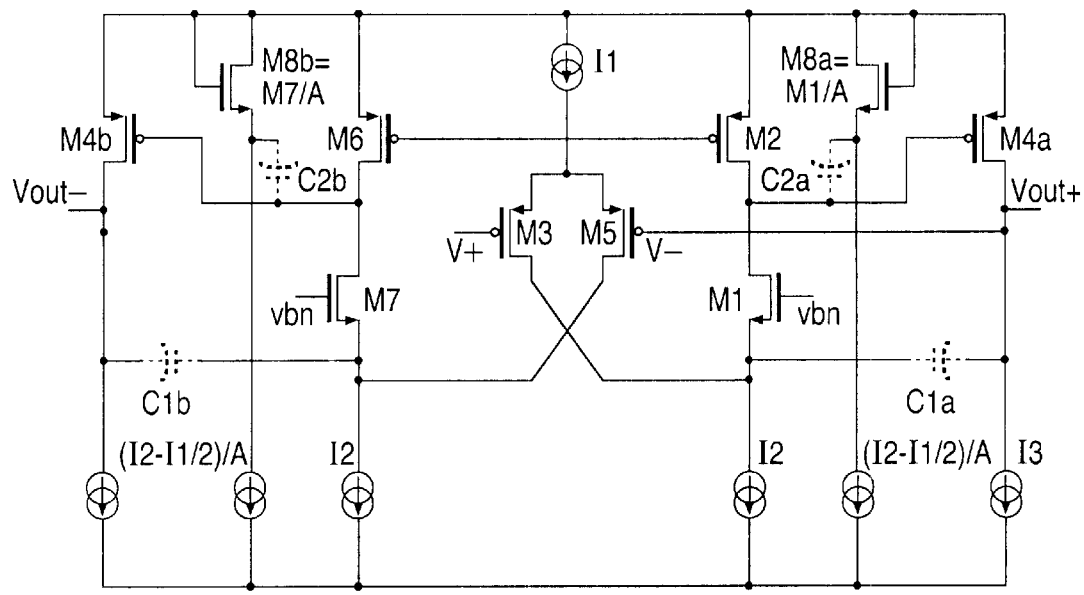
FIG. 25 is a schematic diagram of a differential input folded cascode amplifier in accordance with another embodiment of the presently claimed invention.

FIG. 25 is a differential P-MOSFET input folded cascode amplifier using a an N-MOSFET as the resistance to provide the zero.

Figure 26:
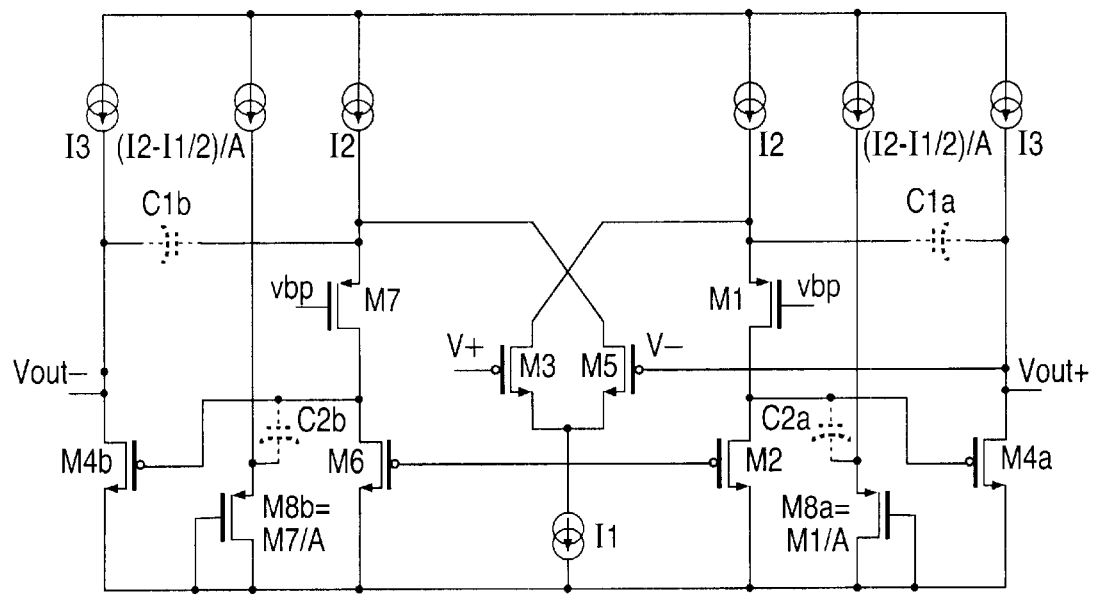
FIG. 26 is a schematic diagram of another differential input folded cascode amplifier in accordance with still another embodiment of the presently claimed invention.

FIG. 26 is a differential N-MOSFET input folded cascode amplifier using a P-MOSFET as the resistance to provide the zero.

Figure 27:
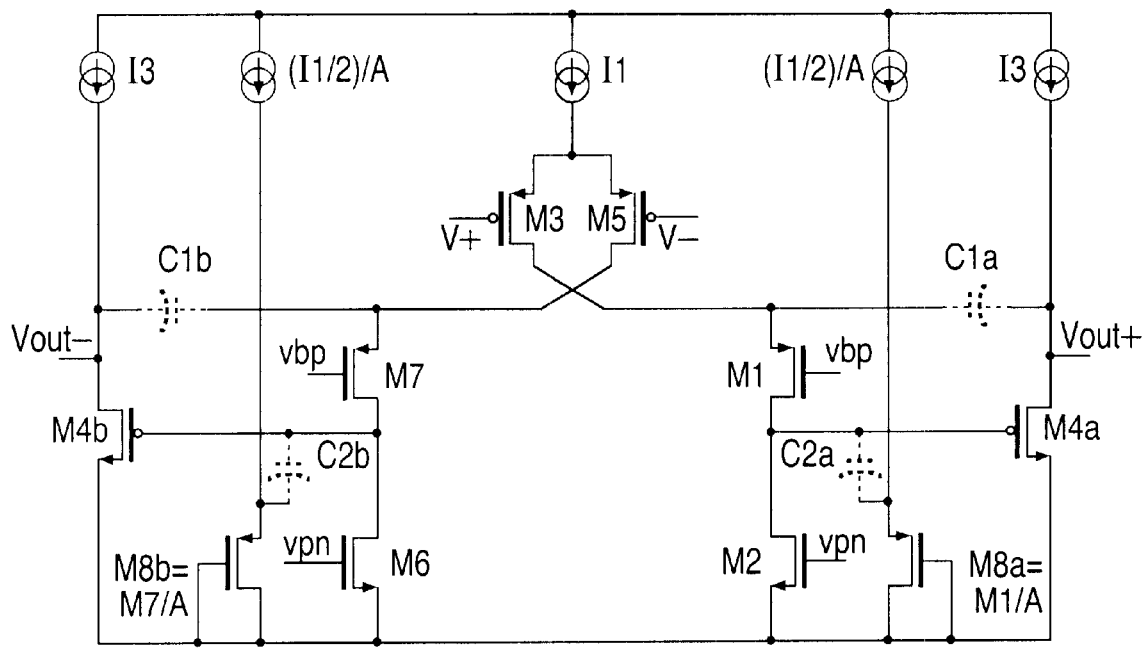
FIG. 27 is a schematic diagram of another telescopic amplifier in accordance with another embodiment of the presently claimed invention.

FIG. 27 is a P-MOSFET telescopic amplifier using a P-MOSFET as the resistance to provide the zero.

Figure 28:
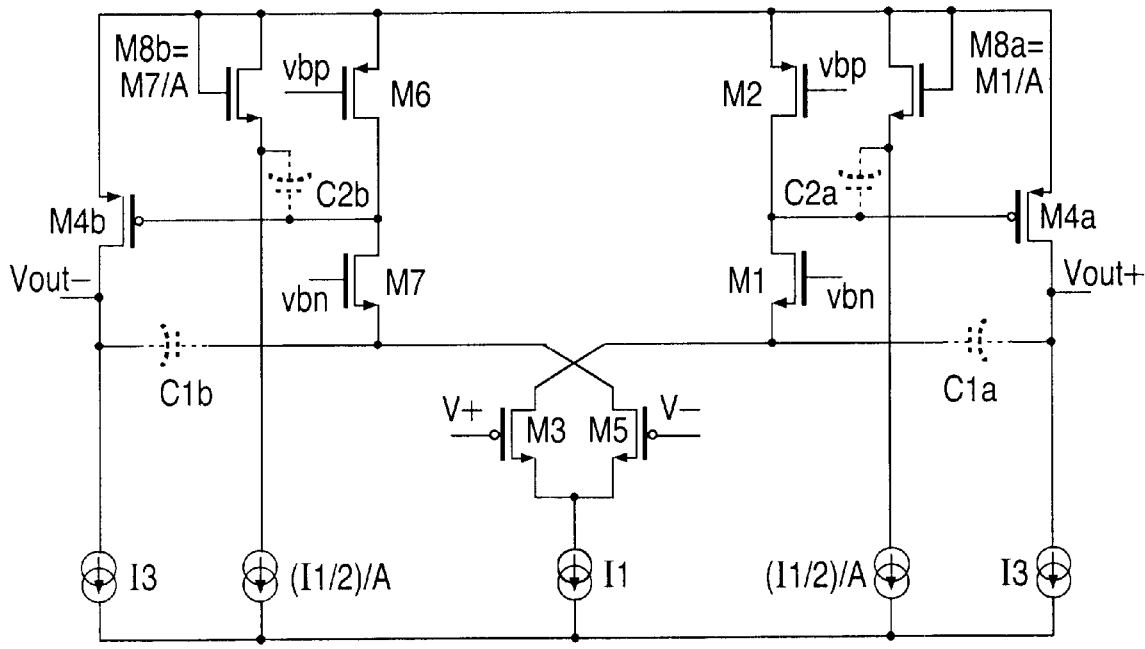
FIG. 28 is a schematic diagram of still another telescopic amplifier in accordance with still another embodiment of the presently claimed invention.

FIG. 28 is an N-MOSFET telescopic amplifier using an N-MOSFET as the resistance to provide the zero.

Figure 29A:
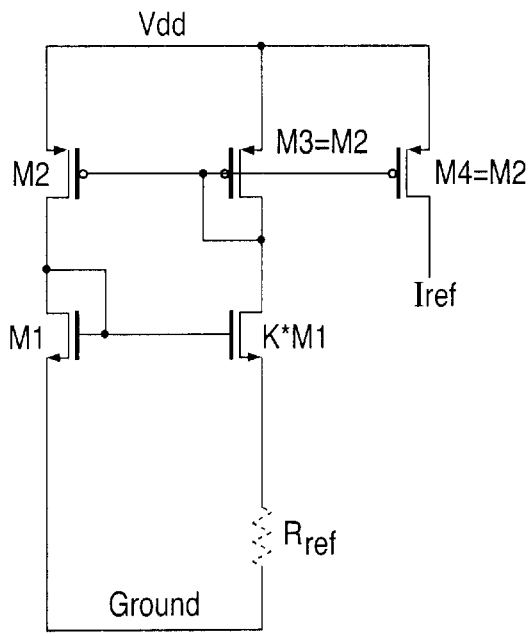
FIGS. 29A and 29B are schematic diagrams for current source and sink circuits for providing a reference current.
Figure 29B:
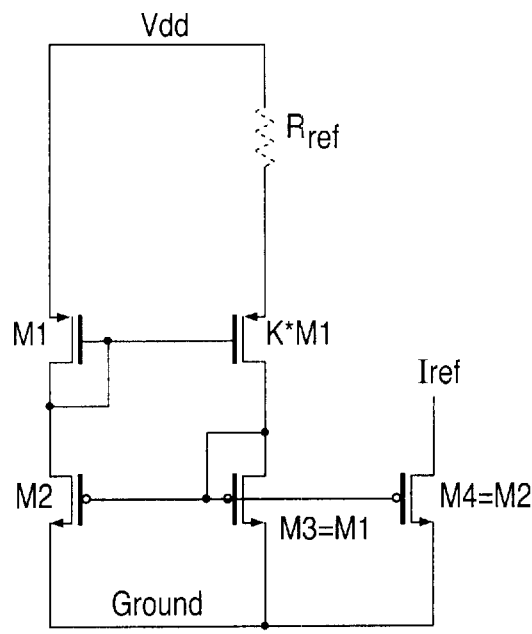

Referring to FIGS. 29A and 29B, one example technique, among many others well known in the art, for providing a current that is proportional to a resistance and transconductance gm of known devices can be implemented as shown. If the Miller compensation capacitor feeds back to the source of an N-MOSFET cascode amplifier, the circuit of FIG. 29A is used. If it feeds back to the source of a P-MOSFET cascode amplifier, the circuit of FIG. 29B is used. In both cases, the transcunductance gm of transistor M1 is defined by Equation 16. Equation 13 (repeated below) describes the resistance needed for the compensation.

Equation 13

$$R_z \approx \frac{A}{gm_1}$$

Equation 16

$$gm_1 = \frac{2}{R_{ref}}\left(1 - \frac{1}{\sqrt{K}}\right)$$

If the circuit is designed such that the reference current Iref from FIG. 29A or 29B flows through the cascode device, as seen in the amplifiers of FIGS. 30–37, and the cascode device is the same as transistor M1, then the compensation resistance is described by Equation 17. It should be understood that the resistance used in this bias circuitry should be of the same material as that used for the resistances in the amplifier for which compensation is intended, thereby ensuring that such resistances will be a function of device ratios only. This biasing technique ensures that the compensation zero more precisely cancels the offending pole over PVT where a resistor is used to provide the zero.

Equation 17

$$R_z = R_{ref}\left(\frac{A}{2\left(1 - \frac{1}{\sqrt{K}}\right)}\right)$$

Figure 30:
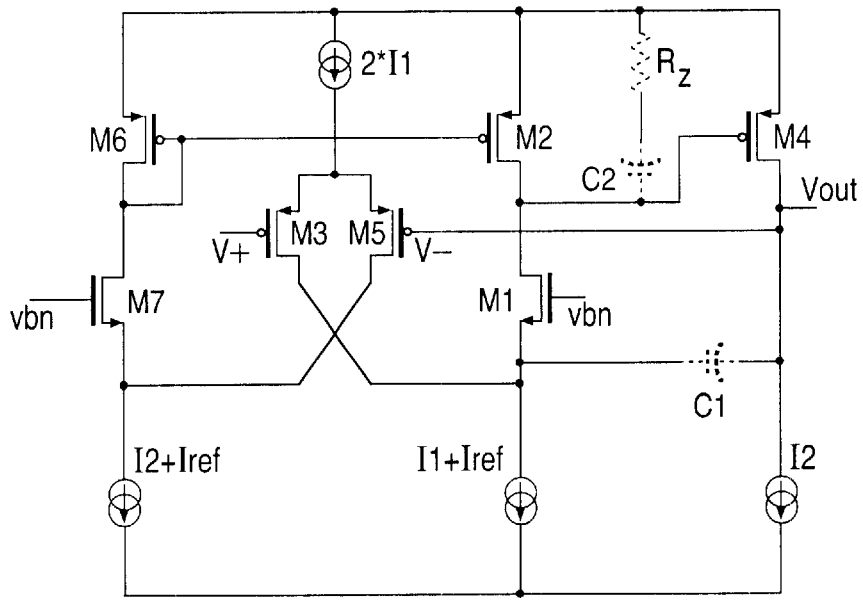
FIG. 30 is a schematic diagram of an input folded cascode amplifier using a resistor in accordance with another embodiment of the presently claimed invention.

FIG. 30 is a P-MOSFET input folded cascode amplifier using a resistor to provide the zero.

Figure 31:
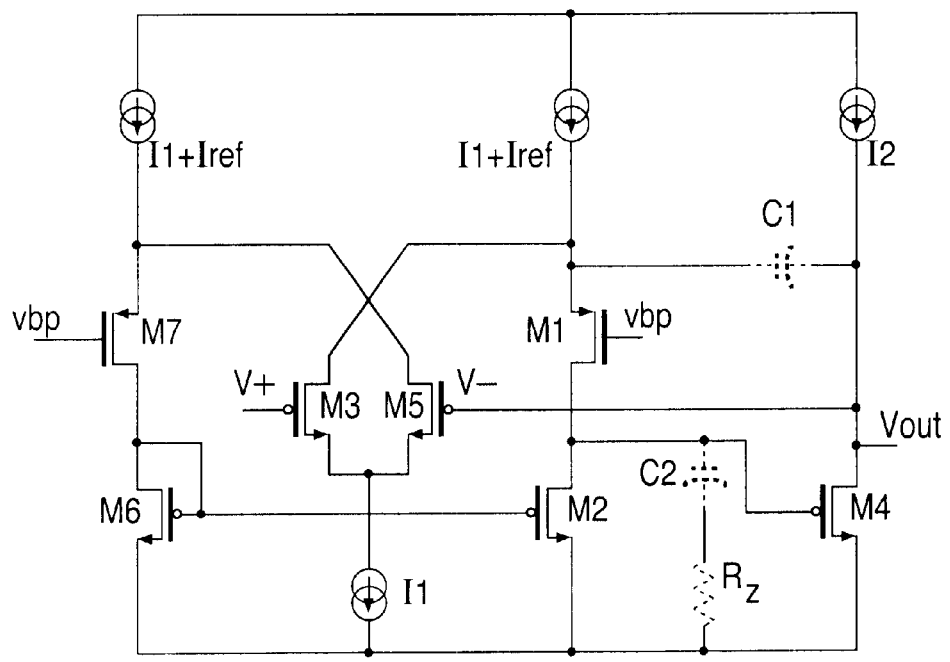
FIG. 31 is a schematic diagram of another input folded cascode amplifier using a resistor in accordance with still another embodiment of the presently claimed invention.

FIG. 31 is an N-MOSFET input folded cascode amplifier using a resistor to provide the zero.

Figure 32:
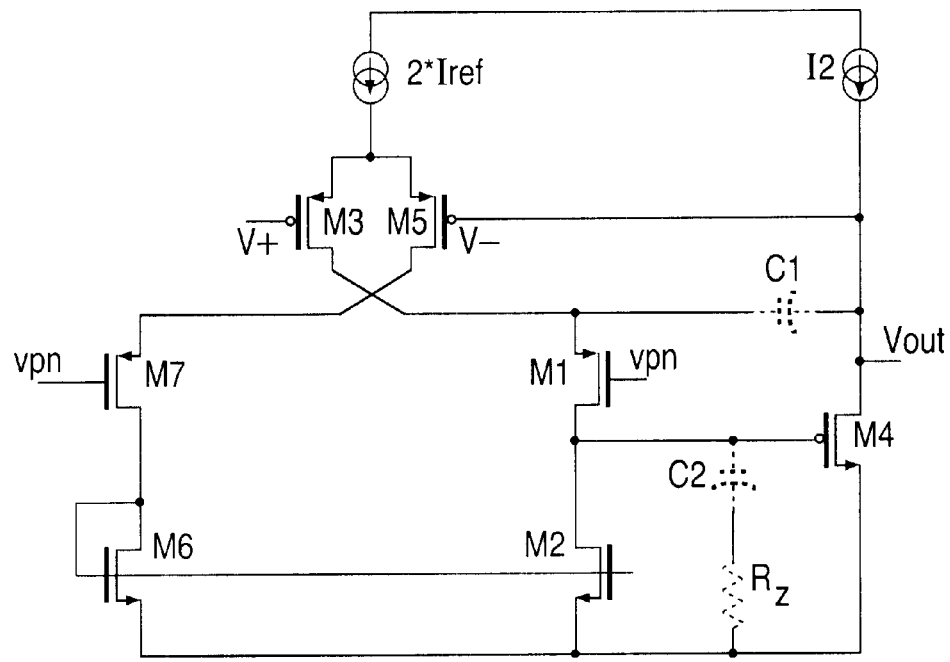
FIG. 32 is a schematic diagram of a telescopic amplifier using a resistor in accordance another embodiment of the presently claimed invention.

FIG. 32 is a P-MOSFET telescopic amplifier using a resistor to provide the zero.

Figure 33:
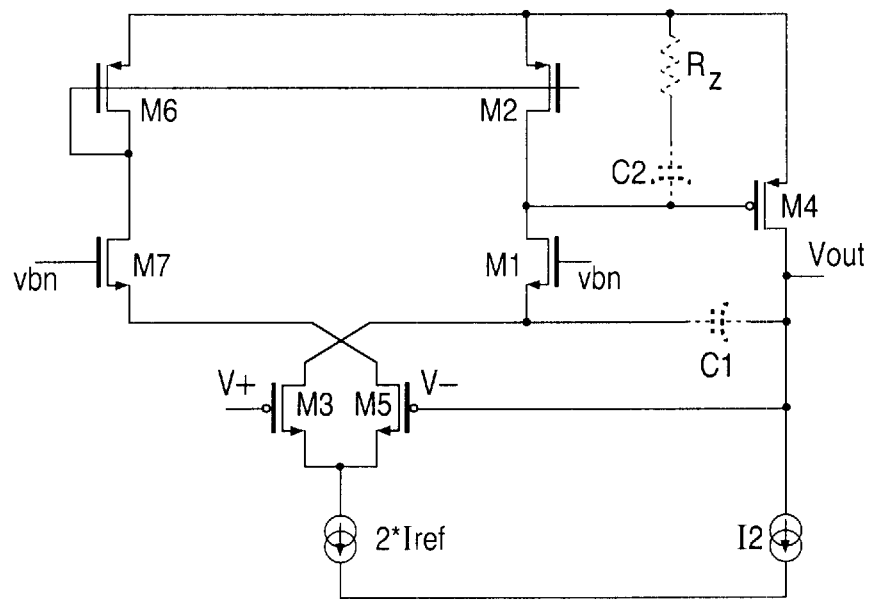
FIG. 33 is a schematic diagram of another telescopic amplifier using a resistor in accordance with still another embodiment of the presently claimed invention.

FIG. 33 is an N-MOSFET telescopic amplifier using a resistor to provide the zero.

Figure 34:
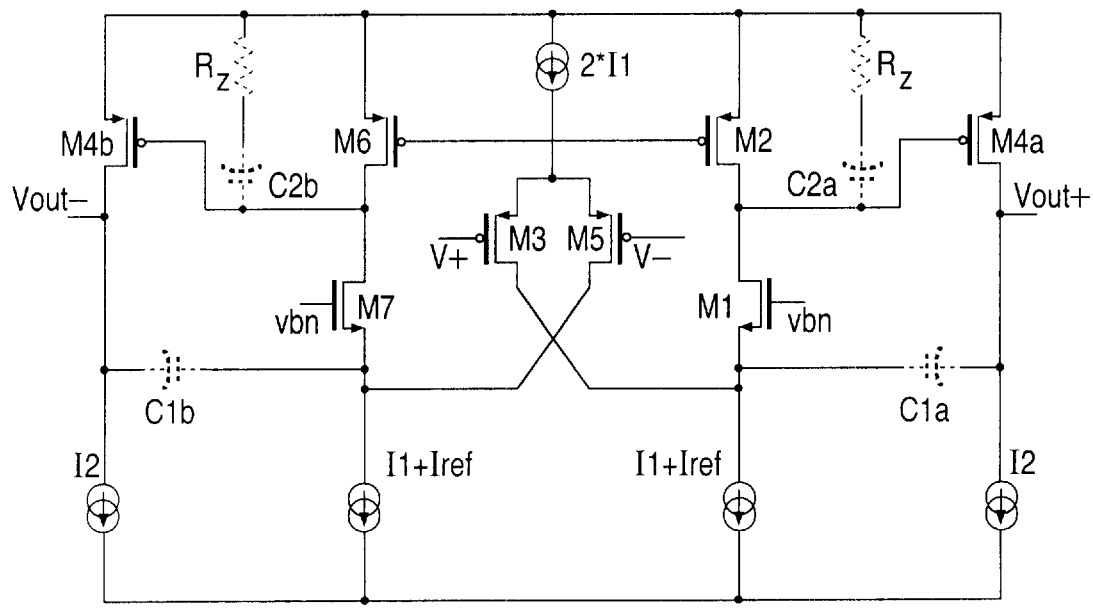
FIG. 34 is a schematic diagram of a differential input folded cascode amplifier using an N-MOSFET in accordance with another embodiment of the presently claimed invention.

FIG. 34 is a differential P-MOSFET input folded cascode amplifier using a resistor to provide the zero.

Figure 35:
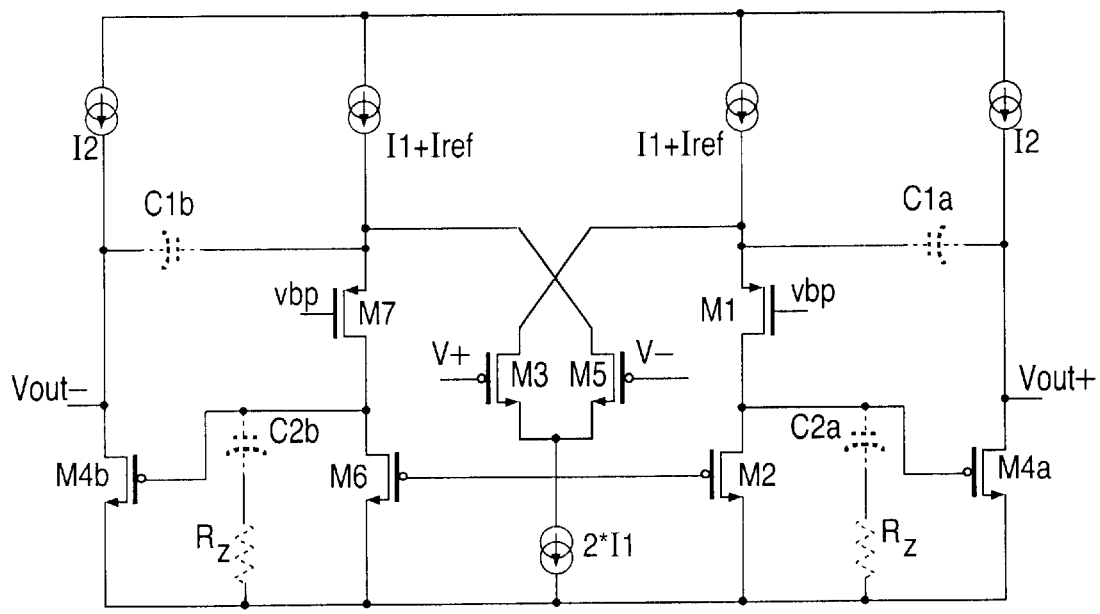
FIG. 35 is a schematic diagram of a differential input folded cascode amplifier using a P-MOSFET in accordance with still another embodiment of the presently claimed invention.

FIG. 35 is a differential N-MOSFET input folded cascode amplifier using a resistor to provide the zero.

Figure 36:
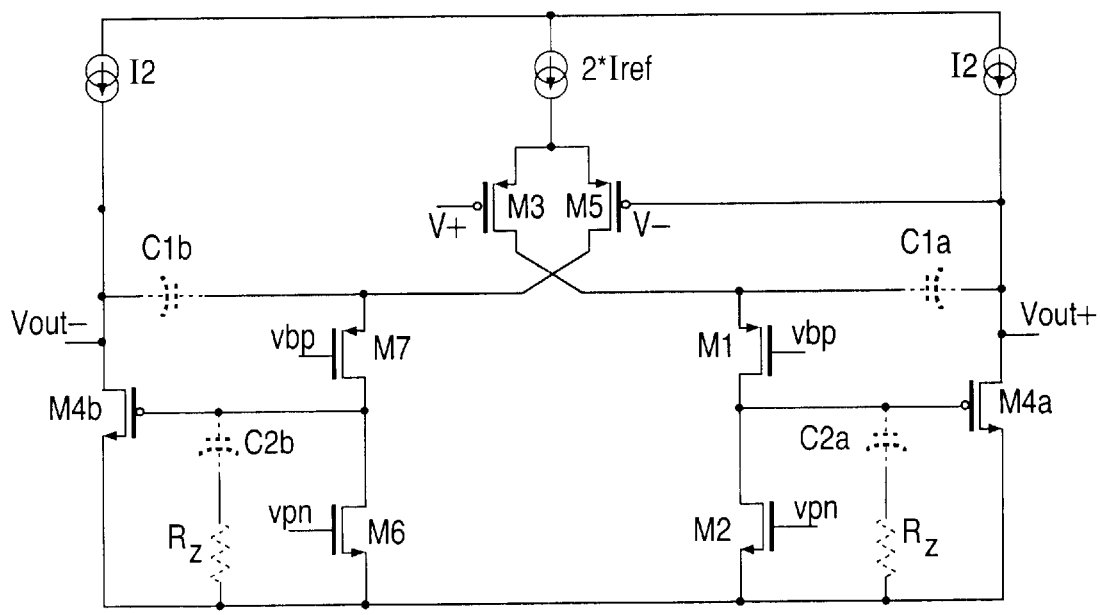
FIG. 36 is a schematic diagram of still another telescopic amplifier using a resistor in accordance with another embodiment of the presently claimed invention.

FIG. 36 is a P-MOSFET telescopic amplifier using a resistor to provide the zero.

Figure 37:
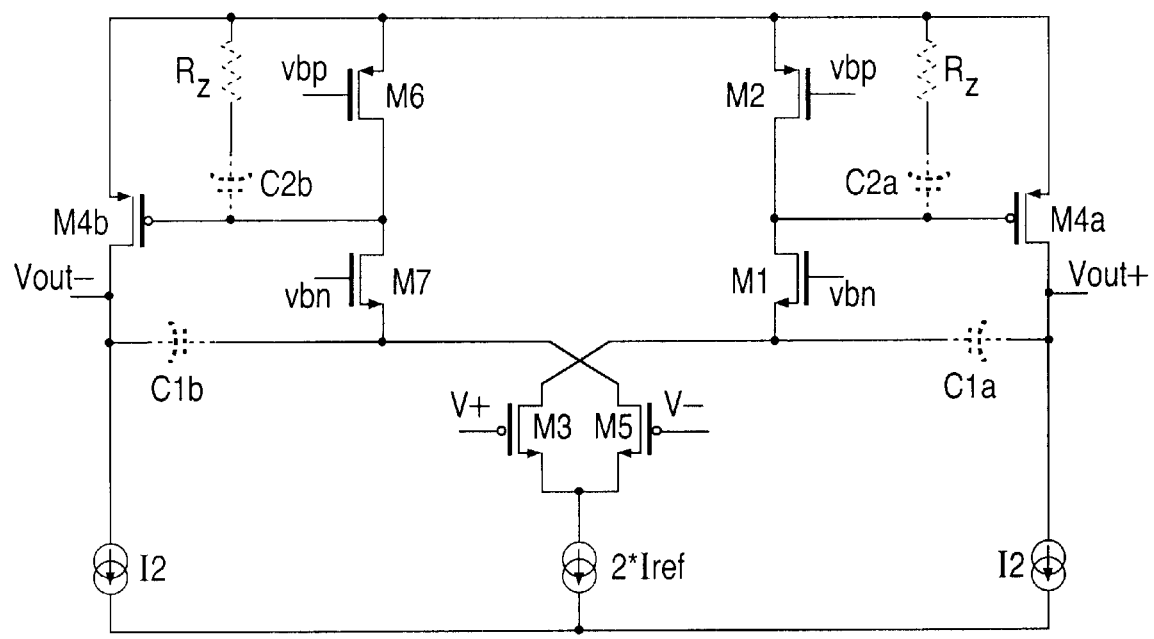
FIG. 37 is a schematic diagram of still another telescopic amplifier using a resistor in accordance with still another embodiment of the presently claimed invention.

FIG. 37 is an N-MOSFET telescopic amplifier using a resistor to provide the zero.

In conformance with the foregoing discussion, while the various embodiments of the presently claimed invention as disclosed in FIGS. 13–37 depict the input stages (transistors M1, M2, M3, M5, M6 and M7) as being differential, it should be understood that the presently claimed invention does not require that the input amplification circuitry be differential. Rather, such differential circuitry as disclosed merely constitutes some of the more preferred embodiments, but amplifiers with Miller-effect frequency compensation in accordance with the presently claimed invention can also have single-ended input amplification circuitry, many forms and implementations of which are well known in the art.

Similarly, while the various embodiments of the presently claimed invention as disclosed in FIGS. 13–37 depict the output stage (transistor M4) as being a common source circuit, it should be understood that such an output circuit topology is not required by the presently claimed invention. Rather, such output circuitry as disclosed merely constitutes a more preferred embodiment, but amplifiers with Miller-effect frequency compensation in accordance with the presently claimed invention can also have other topologies, including but not limited to a common drain configuration.

Further, more than one amplification stage can be included inside the Miller feedback loop. As discussed above, what is important is that the Miller capacitance be fed back back to a low impedance node.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an amplifier with Miller-effect frequency compensation, comprising:

first amplification circuitry, including an internal terminal and a first output terminal, that receives and amplifies an input signal to provide a first amplified signal via said first output terminal, wherein said internal terminal has an internal terminal impedance associated therewith, said first output terminal has an output terminal impedance associated therewith, and said internal terminal impedance is substantially lower than said output terminal impedance;

second amplification circuitry, coupled to said first output terminal and including a second output terminal, that receives and further amplifies said first amplified signal to provide a second amplified signal via said second output terminal;

feedback capacitance coupled between said second output terminal and said internal terminal; and compensation circuitry coupled in shunt to said first output terminal and including capacitive and resistive circuit elements mutually coupled in series.

2. The apparatus of claim 1, wherein said first amplification circuitry comprises a differential amplifier circuit.

3. The apparatus of claim 1, wherein said second amplification circuitry comprises a metal oxide semiconductor field effect transistor in a common source amplifier configuration.

4. The apparatus of claim 1, wherein said feedback capacitance comprises a capacitor.

5. The apparatus of claim 1, wherein said compensation circuitry resistive circuit element comprises a resistor.

6. The apparatus of claim 1, wherein said compensation circuitry resistive circuit element comprises a diode-connected metal oxide semiconductor field effect transistor.

7. An apparatus including an amplifier with Miller-effect frequency compensation, comprising:

first and second power supply terminals;

first amplification circuitry, coupled between said first and second power supply terminals and including an internal terminal and a first output terminal, that receives and amplifies an input signal to provide a first amplified signal via said first output terminal, wherein said internal terminal has an internal terminal impedance associated therewith, said first output terminal has an output terminal impedance associated therewith, and said internal terminal impedance is substantially lower than said output terminal impedance;

second amplification circuitry, coupled between said first and second power supply terminals and to said first output terminal and including a second output terminal, that receives and further amplifies said first amplified signal to provide a second amplified signal via said second output terminal;

feedback capacitance coupled between said second output terminal and said internal terminal; and compensation circuitry coupled between said first output terminal and said first power supply terminal and including serially coupled capacitive and resistive circuit elements.

8. The apparatus of claim 7, wherein said first amplification circuitry comprises a differential amplifier circuit.

9. The apparatus of claim 7, wherein said second amplification circuitry comprises a metal oxide semiconductor field effect transistor in a common source amplifier configuration.

10. The apparatus of claim 7, wherein said feedback capacitance comprises a capacitor.

11. The apparatus of claim 7, wherein said compensation circuitry resistive circuit element comprises a resistor.

12. The apparatus of claim 7, wherein said compensation circuitry resistive circuit element comprises a diode-connected metal oxide semiconductor field effect transistor.

13. An apparatus including an amplifier with Miller-effect frequency compensation, comprising:

first amplifier means for receiving a feedback signal, receiving and amplifying an input signal and providing a first amplified signal;

second amplifier means for receiving and further amplifying said first amplified signal and providing a second amplified signal, wherein said first and second amplifier means together have a transfer function associated therewith;

feedback means for selectively feeding back said second amplified signal as said feedback signal to said first amplifier means, thereby introducing to said transfer function one or more high frequency complex poles; and shunting means for selectively shunting said first amplified signal, thereby introducing to said transfer function at least one high frequency zero that substantially cancels one of said one or more high frequency complex poles.

14. An apparatus including an amplifier with Miller-effect frequency compensation, comprising:

first amplifier means for receiving a feedback signal, receiving and amplifying an input signal and providing a first amplified signal;

second amplifier means for receiving and further amplifying said first amplified signal and providing a second amplified signal;

feedback means for selectively feeding back said second amplified signal as said feedback signal to said first amplifier means; and shunting means for selectively shunting said first amplified signal;

wherein together said first and second amplifier means, said feedback means and said shunting means have associated therewith a transfer function with one or more high frequency complex poles and a high frequency zero which is complementary to one of said one or more high frequency complex poles.

* * * * *